United States Patent
Wojtowicz et al.

(10) Patent No.: US 6,515,316 B1
(45) Date of Patent: Feb. 4, 2003

(54) PARTIALLY RELAXED CHANNEL HEMT DEVICE

(75) Inventors: Michael Wojtowicz, Long Beach, CA (US); Tsung-Pei Chin, Marina Del Rey, CA (US); Michael E. Barsky, Sherman Oaks, CA (US); Ronald W. Grundbacher, Hermosa Beach, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/616,852

(22) Filed: Jul. 14, 2000

(51) Int. Cl.[7] .............................................. H01L 29/778
(52) U.S. Cl. ...................... 257/194; 257/190
(58) Field of Search ................. 257/192, 194, 257/190

(56) References Cited

U.S. PATENT DOCUMENTS 5,221,367 A * 6/1993 Chisolm et al. ............ 148/33
5,367,182 A    11/1994 Matsugatani
5,668,387 A * 9/1997 Streit et al. ................. 257/192

FOREIGN PATENT DOCUMENTS

| EP | 0495452 | 7/1992 |
| GB | 2304998 | 3/1997 |

* cited by examiner

*Primary Examiner*—George Eckert
*Assistant Examiner*—Bradley W. Baumeister
(74) *Attorney, Agent, or Firm*—Connie M. Thousand

(57) ABSTRACT

A HEMT device comprises a buffer layer disposed over a substrate. A partially-relaxed channel is disposed over the buffer layer and a barrier layer is disposed over the channel. A cap layer is disposed over the barrier layer and a gate is positioned on the barrier layer. A source and a drain are positioned on the barrier layer on opposite sides of the gate.

9 Claims, 2 Drawing Sheets

PARTIALLY RELAXED CHANNEL HEMT DEVICE

BACKGROUND OF THE INVENTION

The present invention relates generally to High Electron Mobility Transistor (HEMT) devices and more particularly, to a HEMT device having a partially relaxed channel.

Referring to FIG. 1, a typical prior art HEMT device 10 comprises a buffer layer 12 which is grown on a substrate 14. A pseudomorphic channel 16 is grown on the buffer layer 12, and, a barrier layer 18 is grown on the channel 16. The barrier layer 18 typically includes a doping layer 20 disposed near the channel 16. A cap layer 22 is disposed on the barrier layer 18. The buffer layer 12 and the barrier layer 18 provide confinement of the carriers in the channel 16. The buffer layer 12 additionally isolates the channel 16 from the substrate 14. To complete the HEMT device 10, a gate 23 is positioned on the barrier layer 18 through a recess 24 formed in the cap layer 22. A source 24 and a drain 24 are positioned on the cap layer 22 on either side of the gate 23.

A thick channel 16 is desirable because a thicker channel 16 provides improved containment of the carriers which improves the electrical properties of the HEMT device 10. Therefore, it is desirable to fabricate the channel 16 as thick as possible. However, the thickness of the channel 16 is limited to a thickness which maintains the material in the channel 16 in a pseudomorphic state. In a pseudomorphic state, the material of the channel 16 is under strain with no defects in the material resulting from strain relaxation. Defects in the material of the channel 16 caused by strain relaxation begin to appear once the channel 16 is fabricated to a thickness greater than the critical thickness. When defects are present in the channel 16, the channel 16 is referred to as being either partially-relaxed or fully-relaxed. Partially-relaxed and fully-relaxed are terms used in the industry to distinguish between levels of defects in the material. A partially-relaxed material has some level of defects but not enough to cause the material to lose all beneficial material properties, whereas a fully-relaxed material has enough defects to cause the material to lose most of its beneficial properties.

Any level of defects in the material of the channel 16 are considered by those skilled in the art to be undesirable because defects are thought to reduce the DC and RF performance of the HEMT device 10. Therefore, the channel 16 of the prior art HEMT device 10 is only grown below the critical thickness, so that defects in the channel 16 can be avoided. This means that the typical HEMT device 10 has a relatively thin channel. 16. A thin channel 16 poorly confines the carriers in the channel 16 which limits the gain and frequency response of the HEMT device 10.

What is desired therefore is a HEMT device which provides a higher gain and frequency response than provided by the prior art HEMT device 10.

SUMMARY OF THE INVENTION

The proceeding and other shortcomings of the prior art are addressed and overcome by the present invention which provides a HEMT device comprising a buffer layer disposed on a substrate. A partially-relaxed channel is disposed on the buffer layer and a barrier layer is disposed on the channel. A cap layer is disposed on the barrier layer and a gate is positioned on the barrier layer. A source and a drain are positioned on the barrier layer on opposite sides of the gate.

In a second aspect the channel is fabricated of a material which, when disposed to a first thickness is pseudomorphic; and, when disposed to a second thickness, is fully-relaxed. The channel is fabricated to a thickness intermediate the first and second thicknesses.

In a third aspect, the present invention provides a method for fabricating a HEMT device having a gate, a source and a drain. A buffer layer is deposited on a substrate. A partially-relaxed channel is deposited on the channel and a barrier layer is deposited on the channel. A cap layer is deposited on the barrier layer and the gate is positioned on the cap layer through a recess formed in the cap layer. The source and the drain are positioned on the cap layer on opposite sides of the gate.

BRIEF DESCRIPTION OF THE DRAWINGS

Reference is now made to the detailed description of the preferred embodiments, illustrated in the accompanying drawings, in which.

DETAILED DESCRIPTION OF THE PREFERRED EMBODIMENTS

Figure 1:
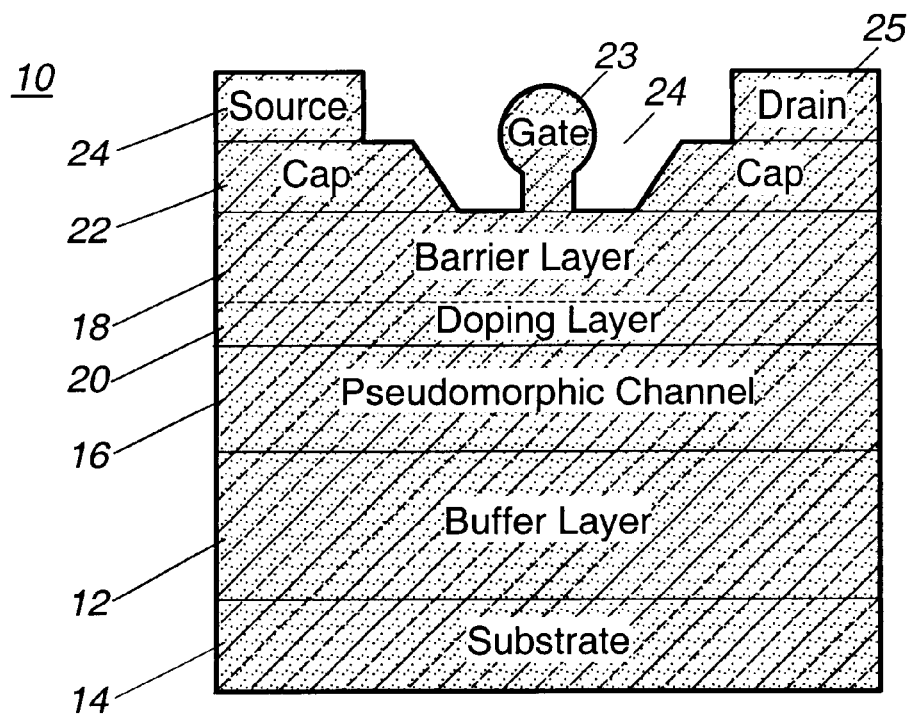
FIG. 1 shows a cross-sectional view of prior art HEMT device.
Figure 2:
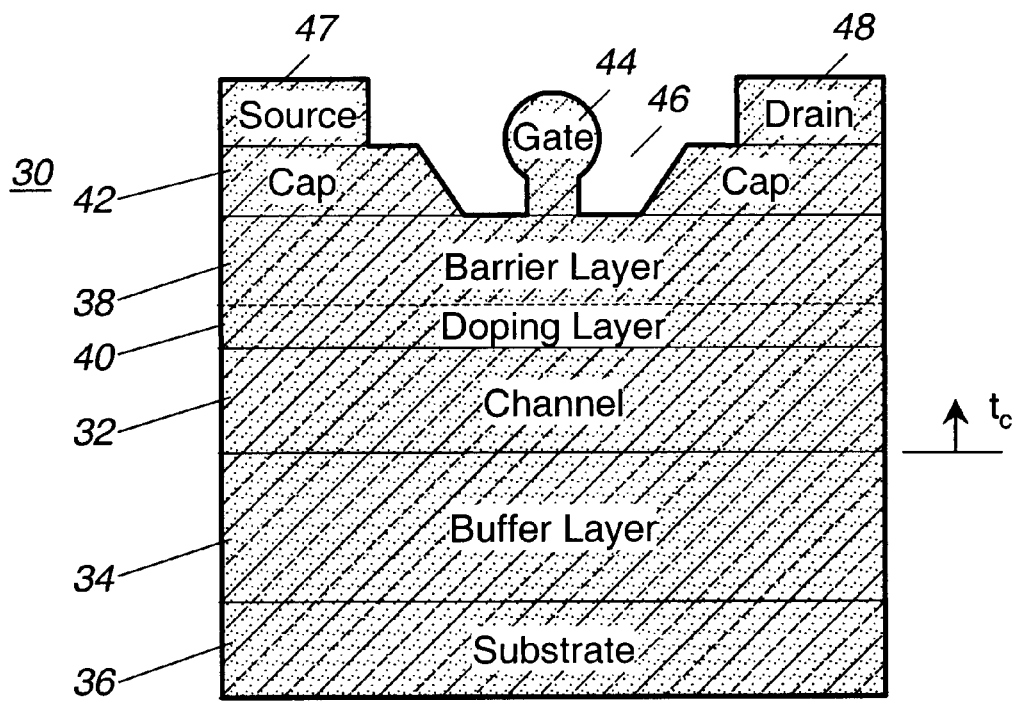
FIG. 2 shows a cross-sectional view of a HEMT device in accordance with the preferred embodiment of the present invention; and, FIG. 3 shows a graph comparing the frequency performance of HEMT devices having channel thicknesses of 15, 20 and 25 nm corresponding to partially relaxed channels with increasing defect densities, respectively.

Referring to FIG. 2, the present invention addresses and overcomes the disadvantages of the prior art by providing a HEMT device 30 having a partially-relaxed channel 32 which is thicker than the pseudomorphic channel 16 (FIG. 1) of the prior art HEMT device 10. The partially-relaxed channel 32 (FIG. 2) does contains some defects which, as mentioned above, are considered by those skilled in the art to decrease the RF and DC performance of the HEMT device 30. However, this has not proven to be the case. As will subsequently be discussed, tests have shown that a certain level of defects is acceptable and actually provides a HEMT device 30 having an improved RF and DC performance.

A HEMT device 30 in accordance with the present invention includes a buffer layer 34 disposed or grown over a substrate 36 and a channel 32 disposed or grown over the buffer layer 34. A barrier layer 38 is grown over the channel 32 and preferably includes a doping layer 40 near the channel 32. The doping layer 40 is preferably a Si planar doping layer. The buffer layer 34 and the barrier layer 38 provide confinement of the carriers in the channel 32. The buffer layer 34 additionally isolates the channel 32 from the substrate 14. To complete the HEMT device 30, a cap 42 is disposed on the barrier layer 38 and a gate 44 is positioned on the barrier layer 38 through a recess 46 formed in the cap layer 42. A source 47 and a drain 48 are positioned on the cap layer 42 on either side of the gate.

The buffer layer 34 and barrier layer 38 both provide containment of the carriers in the channel 32. To do so, the buffer layer 34 and barrier layer 38 must each be fabricated of a different material than the channel 32. In addition, the lattice constant of the material comprising the channel 32 must be different than the lattice constant of each of the materials comprising the buffer layer 34 and the barrier layer 38. A strain exists between the buffer layer 34 and the channel 32 because the lattice constant of the channel 32 is different than the lattice constant of the buffer layer 34. The strain increases as the channel thickness $t_c$ is increased. The material of the channel 32 can tolerate a certain level of strain without generating defects in the material of the channel 32. As such, the channel 32 can be fabricated to a predetermined thickness $t_c$ free of defects. The defect-free state is known as a pseudomorphic state. At a certain higher level of strain associated with a thicker channel 32, defects appear in the material of the channel 32. This defect-containing state is known as a partially-relaxed state. When the channel 32 is fabricated even thicker, the strain further increases and the number of defects in the material of the channel 32 increases until a sufficient number of defects exist in the material of the channel 32 to reduce virtually all the desirable properties of the material. This state is known as a fully-relaxed state.

The exact thickness $t_c$ at which the channel 32 becomes partially-relaxed or fully relaxed is determined by the material properties of the channel 32 as well as the material properties of the buffer layer 34. For example, in an InP based HEMT device having an InAlAs buffer layer 34 and an InGaAs channel 32 with 75% In, the channel 32 is pseudomorphic below a thickness of approximately 15 nanometers and is fully-relaxed above a thickness of about 30 nanometers. The channel 32 is thus partially-relaxed between a thickness of about 15 and 30 nanometers. In contrast, for a GaAs based HEMT device having a composite GaAs/AlGaAs buffer layer 34 and an InGaAs channel 32 with 21% In, the channel 32 is pseudomorphic below a thickness of approximately 15 nanometers and is fully-relaxed above a thickness of about 22 nanometers. The channel 32 is partially-relaxed between a thickness of about 15 and 22 nanometers.

Figure 3:
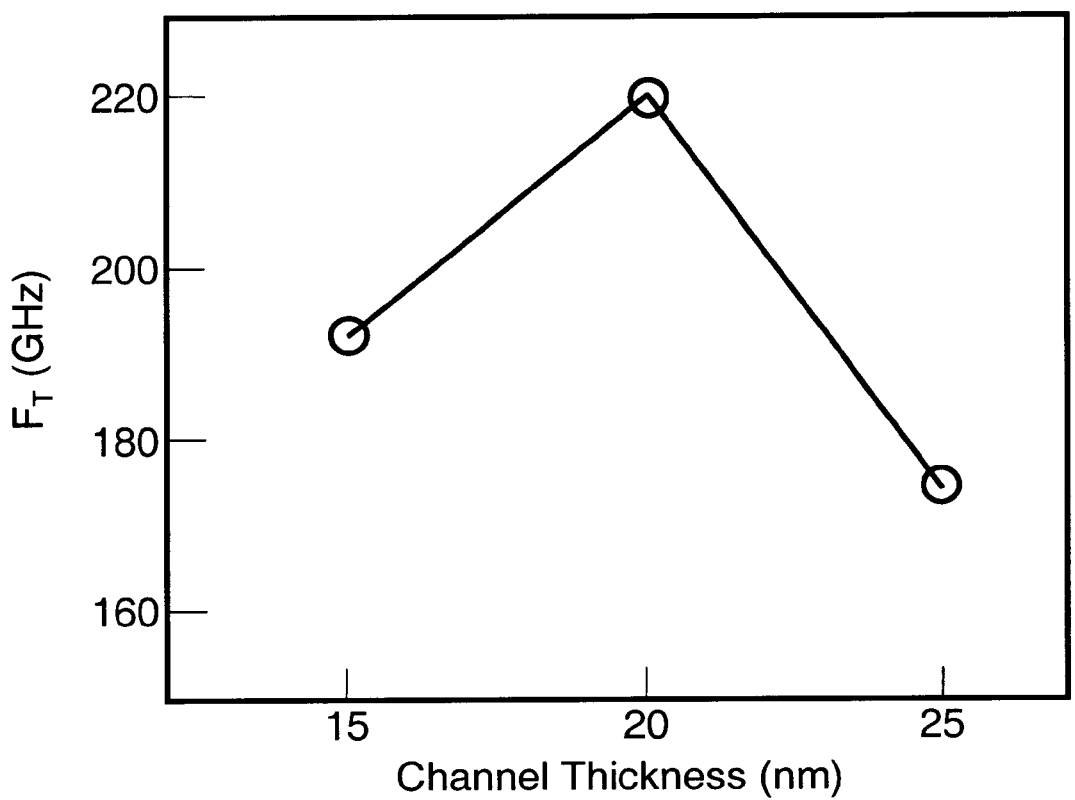

Referring to FIGS. 2 & 3, HEMT devices 30 having 15, 20 and 25 nm thick channels 32 were fabricated and tested. Thicknesses of 15, 20 and 25 nm correspond to pseudomorphic, partially-relaxed and fully-relaxed channels 32 respectively. For each of these HEMT devices, the buffer layer 32 was fabricated of an InAlAs material to a thickness of 300 nm; the channel 32 was fabricated of an InGaAs material which comprised 75% In; and, the barrier layer 38 was fabricated of 280 nm thick InAlAs material which included a Si planar doping layer 40 near the channel 32. The cap 42 was fabricated of an InGaAs material. The frequency response (FT) of each HEMT device was measured and is shown graphically in FIG. 3. As depicted in this graph, the HEMT device having a partially-relaxed channel (channel thickness=20 nm) provided an improved frequency response when compared to a HEMT device having a pseudomorphic channel (channel thickness=15 nm) or a HEMT device having a partially relaxed channel (channel thickness=25 nm) with a higher degree of relaxation.

As will be appreciated by one skilled in the art, the present invention is not limited to the structures and figures shown and described hereinabove but can be practiced with any HEMT device known to one skilled in the art in which the lattice constant of the channel is different than the lattice constant of the buffer layer. For example, the present invention can be practiced in an AlGaN/GaN/InGaN HEMT device or an AlGaSb/InSb/GaSb HEMT device. It will be appreciated that many variations of the invention are possible and the invention is limited only by the claims which follow.

What is claimed is:

1. An InP high electron mobility transistor (HEMT) device having a frequency response comprising:

buffer layer disposed over a substrate;

a partially-relaxed channel disposed over said buffer layer to a sufficient thickness so that dislocations form in the channel in more than one direction;

a cap layer disposed over said barrier layer;

a gate positioned on said barrier layer; and a source and a drain positioned on said cap layer, wherein said frequency response of said HEMT device is improved when compared to a HEMT device having a channel with dislocations in only a single direction.

2. A HEMT device as in claim 1, further comprising a doping layer disposed on said channel.

3. An InP high electron mobility transistor (HEMT) device having a frequency response comprising:

a buffer layer disposed over a substrate;

a partially-relaxed channel disposed over said buffer layer fabricated of a material which when disposed to a first thickness is pseudomorphic and when disposed of a second thickness is fully relaxed, said channel having a thickness intermediate said first and second thicknesses and being of a sufficient thickness so that dislocations form in more than one direction;

a barrier layer disposed over said channel;

a cap layer disposed over said barrier layer;

a gate positioned on said barrier layer; and a source and a drain positioned on said cap layer.

4. A HEMT device as in claim 3, wherein said channel comprises an InGaAs material.

5. A HEMT device as in claim 4, wherein said InGaAs material comprises approximately 75% In.

6. An InP high electron mobility transistor (HEMT) device having a frequency response comprising:

a buffer layer disposed over a substrate;

a partially-relaxed channel disposed over said buffer layer, said partially relaxed channel comprising a material having a lattice constant, said buffer layer comprising a material having a lattice constant different than the lattice constant of the channel material, said partially-relaxed channel fabricated of a material which when disposed to a first thickness is pseudomorphic and when disposed of a second thickness is fully relaxed, said channel having a thickness intermediate said first and second thickness and being of a sufficient thickness so that dislocations form in more than one direction;

a barrier layer disposed over said channel;

a cap layer disposed over said barrier layer;

a gate positioned on said barrier layer; and a source and a drain positioned on said cap layer.

7. A HEMT device as in claim 6, wherein said partially relaxed channel comprises an InGaAs material.

8. A HEMT device as in claim 7, wherein said partially relaxed channel comprises substantially 75% In.

9. An InP high electron mobility transistor (HEMT) device having a frequency response comprising:

a buffer layer disposed over a substrate;

a partially-relaxed channel disposed over said buffer layer, said partially relaxed channel comprising a composite GaAs/InGaAs material and having a lattice constant, said buffer layer comprising a material having a lattice constant different than the lattice constant of the channel material, said partially-relaxed channel fabricated of a material which when disposed to a first thickness is pseudomorphic and when disposed of a second thickness is fully relaxed, said channel comprising a composite GaAs/InGaAs material having a thickness between approximately 22 and 30 nanometers which is intermediate said first and second thickness;

a barrier layer disposed over said channel;

a cap layer disposed over said barrier layer;

a gate positioned on said barrier layer; and a source and a drain positioned on said cap layer.

* * * * *